(12) United States Patent
Chiesa (10) Patent No.: US 8,729,932 B2
(45) Date of Patent: May 20, 2014

(54) FREQUENCY MULTIPLIER

(75) Inventor: John A. Chiesa, Pelham, NH (US)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 12/932,073

(22) Filed: Feb. 17, 2011

(65) Prior Publication Data

US 2011/0227612 A1      Sep. 22, 2011

Related U.S. Application Data

(60) Provisional application No. 61/338,488, filed on Feb. 19, 2010.

(51) Int. Cl.
*H03B 19/00* (2006.01)
(52) U.S. Cl.
USPC .......................................... 327/119; 327/116
(58) Field of Classification Search
USPC .......................................... 327/116, 119, 120
See application file for complete search history.

(56) References Cited

U.S. PATENT DOCUMENTS

| 3,296,517 | A  | * | 1/1967  | Routh et al. ................. 327/231 |
| 3,355,655 | A  |   | 11/1967 | Burckhardt |
| 5,077,546 | A  |   | 12/1991 | Carfi et al. |
| 7,187,917 | B2 | * | 3/2007  | Lin et al. ....................... 455/323 |
| 2008/0030244 | A1 |   | 2/2008 | Leifso |
| 2009/0004994 | A1 |   | 1/2009 | Rafi et al. |

OTHER PUBLICATIONS

Yin et al., "A Low-Jitter Polyphase-Filter-Based Frequency Multiplier With Phase Error Calibration", IEEE Transactions on Circuits and Systems—II: Express Briefs, vol. 55, No. 7, Jul. 2008, pp. 663-667.
European Patent Office, Partial European Search Report for Application No. EP 11250189, dated Feb. 5, 2013, 5 pgs.

* cited by examiner

*Primary Examiner* — William Hernandez
(74) *Attorney, Agent, or Firm* — Iandiorio Teska & Coleman, LLP (57) ABSTRACT

A frequency multiplier for generating an output signal having a frequency N times the input signal, with N equal to or greater than 3, the frequency multiplier including a phase splitter circuit responsive to the input signal for generating N signals with phase differences, and a mixer circuit responsive to the N signals of the phasor circuit for providing an output signal having a frequency N times the input signal.

28 Claims, 6 Drawing Sheets

| Phase | I scaling factor | Q scaling factor |
|---|---|---|
| 0° | 1 | 0 |
| 120° | -0.500 | 0.866 |
| 240° | 0.500 | -0.866 |

*FIG. 9A*

| Phase | I scaling factor | Q scaling factor |
|---|---|---|
| 0° | 1 | 0 |
| 45° | 0.707 | 0.707 |
| 90° | 0 | 1 |
| 135° | -0.707 | 0.707 |

FREQUENCY MULTIPLIER

RELATED APPLICATIONS

This application hereby claims the benefit of and priority to U.S. Provisional Application Ser. No. 61/338,488, filed on Feb. 19, 2010 under 35 U.S.C. §§119, 120, 363, 365, and 37 C.F.R. §1.55 and §1.78, which application is incorporated herein by reference.

FIELD OF THE INVENTION

The subject invention relates to a frequency multiplier.

BACKGROUND OF THE INVENTION

Frequency multiplication is an important function required in many frequency generation circuits used in communications and instrumentation systems. An important performance metric of these multiplication circuits is the spectral purity of the output. Undesired harmonics are preferably suppressed.

The conventional general design approach of frequency triplers is to use a non-linear circuit that generates odd-order harmonics of the input and attenuates even-order harmonics. Filtering is then used to attenuate all the harmonics except the desired third harmonic. One common example of this approach is the use of anti-parallel diodes. Under RF drive, currents in the 2 anti-parallel diodes will cancel at even-order harmonics, while the odd-order harmonics will add. Another common approach is the use of an amplifier running in compression, which generates a square waveform that is rich in odd harmonics.

A drawback of these approaches is that the circuits associated with them both generate an output at the fundamental frequency that has significantly higher power than the desired third harmonic signal. Thus, these two common approaches are inherently inefficient at creating the desired third harmonic.

Filtering and/or feed-forward cancellation may be used to null the relatively large fundamental frequency from the output spectrum. However, both filtering and feed-forward cancellation may undesirably restrict the frequency bandwidth.

Another demonstrated approach is to first double the frequency of the input signal, then mix the fundamental with the doubled frequency to generate the third harmonic. By using a single-sideband mixer, it is possible to attenuate the undesired fundamental frequency at the mixer output. Although this approach helps mitigate the large spurious at the fundamental frequency, it requires creating the second harmonic and this spurious as well as the fourth harmonic are unavoidable at the output.

BRIEF SUMMARY OF THE INVENTION

It is therefore an object of this invention to provide a frequency multiplier that provides an output with improved spectral purity.

It is a further object of this invention to provide such a frequency multiplier in which the fundamental frequency does not have significantly higher power than the desired harmonic signal.

It is a further object of this invention to provide such a frequency multiplier that does not require the use of filtering and/or feed-forward cancellation.

The subject invention, however, in other embodiments, need not achieve all these objectives and the claims hereof should not be limited to structures or methods capable of achieving these objectives.

The invention results from the realization that an improved frequency multiplier can be achieved by a phase splitter circuit responsive to an input signal for generating N signals with phase differences, and a mixer circuit responsive to the N signals of the phase splitter circuit for providing an output signal having a frequency N times the input signal.

The frequency multiplier achieves suppression of the unwanted harmonics over a broad band of frequencies without filtering. The frequency multiplier is inherently able to achieve operation over a wider bandwidth than conventional approaches, since the unwanted harmonics are not generated, eliminating the need for bandwidth limiting filters and/or feed-forward cancellation.

While embodiments of the invention relate to frequency triplers, it can be used for any multiplication ratio.

This invention features a frequency multiplier for generating an output signal having a frequency N times an input signal, with N equal to or greater than 3. The frequency multiplier includes a phase splitter circuit responsive to the input signal for generating N signals with phase differences, and a mixer circuit responsive to the N signals of the phase splitter circuit for providing an output signal having a frequency N times the input signal.

In one embodiment, the phase splitter circuit may include a quadrature circuit responsive to the input signal for generating I and Q signals and a phasor circuit responsive to the quadrature circuit. The frequency multiplier may include amplifier circuits responsive to the phasor circuit for amplifying the N signals. The difference of phase between the signals may be approximately 360°/N. The difference of phase between the signals may be approximately 180°/N. N may be equal to 3. N may be equal to or greater than 4. The quadrature circuit may include an R-C polyphase network. The quadrature circuit may include a distributed quadrature network. The distributed quadrature network may be a Lange coupler. The input signal may be a differential input signal. The input signal may be a single-ended signal. The phasor circuit may include a transconductance circuit for generating an output current that is linearly proportional to the I or Q signals. The phasor circuit may include common load resistors for adding the currents from the transconductance circuits to create a predetermined phase. The amplifier circuits may convert the N signals from sine waves to square-waves. The amplifier circuits may include a single stage amplifier to amplify each of the N signals. The amplifier circuits may include two or more amplifier stages to amplify some of the N signals. The mixer circuit may be a 3 input stacked gilbert-cell mixer. N may be equal to 4 and the mixer circuit may include four levels of transistors to accommodate four balanced inputs. The mixer circuit may include cascaded mixers. The mixer circuit may multiply the N signals of the phasor circuit to provide an output signal which may have a frequency N times the input signal.

This invention also features a frequency multiplier for generating an output signal having a frequency N times the input signal, with N equal to or greater than 3, the frequency multiplier including a quadrature circuit responsive to the input signal for generating I and Q signals, a phasor circuit responsive to the quadrature circuit for generating N signals with phase multiples of approximately 360°/N, amplifier circuits responsive to the phasor circuit for amplifying the N signals, and a mixer circuit responsive to the amplifier circuits for multiplying the amplified N signals to provide an output signal having a frequency N times the input signal.

This invention further features a frequency multiplier for generating an output signal having a frequency N times the input signal, with N equal to or greater than 3, the frequency multiplier including a quadrature circuit which is responsive to the input signal for generating I and Q signals, a phasor circuit responsive to the quadrature circuit for generating N signals with phase multiples of approximately 180°/N, amplifier circuits responsive to the phasor circuit for amplifying the N signals and converting the N signals from sine waves to square-waves, and a mixer circuit responsive to the amplifier circuits for detecting transitions of the amplified N signals to provide an output signal having a frequency N times the input signal.

This invention further features a method for generating an output signal having a frequency N times the input signal, with N equal to or greater than 3. The method includes generating N signals with phase differences; and mixing the N signals to providing an output signal having a frequency N times the input signal. The method may further include generating I and Q signals in response to the input signal. The method may further include amplifying the N signals. The difference of phase between the signals may be approximately 360°/N. The difference of phase between the signals may be approximately 180°/N.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
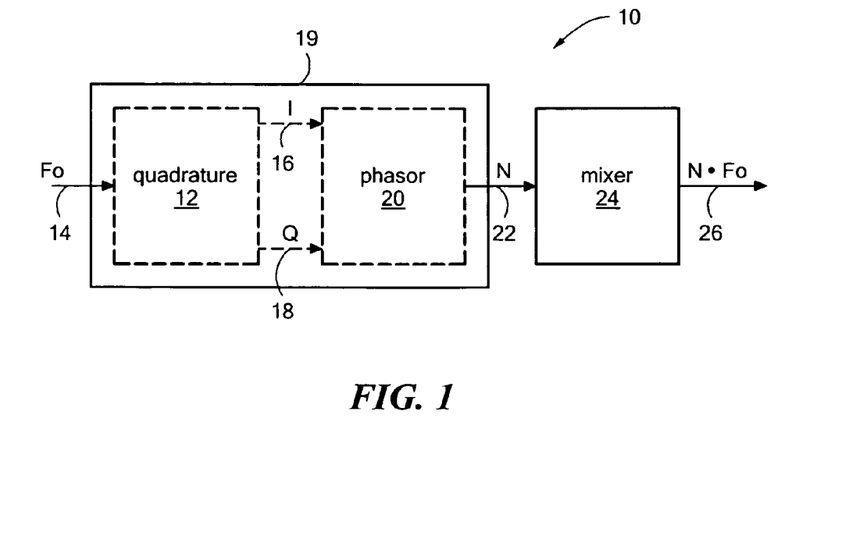
FIG. 1 is a block diagram of a frequency multiplier in accordance with the invention.
Figure 2:
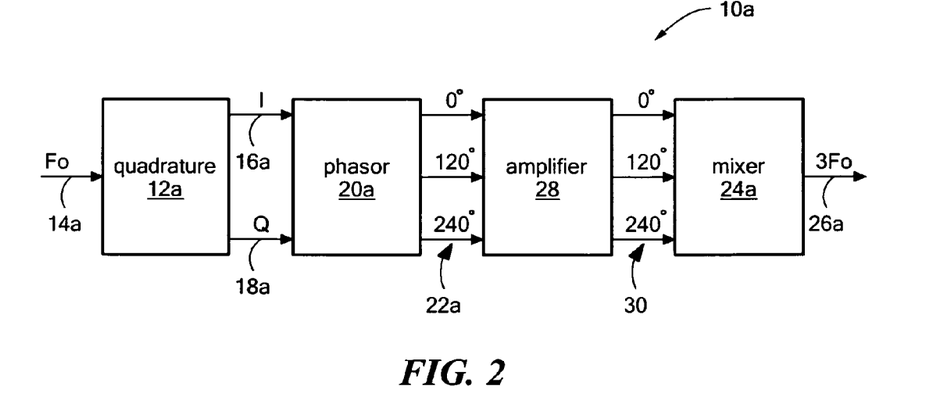
FIG. 2 is a block diagram of one embodiment the frequency multiplier of FIG. 1 in which the frequency multiplier is a frequency tripler.

There is shown in FIG. 1 a frequency multiplier 10 that generates an output signal having a frequency N times the input signal in accordance with the invention. Frequency multiplier 10 includes a phase splitter circuit 19 responsive to the input signal 14 for generating N signals with phase differences on N lines 22. A mixer circuit 24 is responsive to the N signals of phase splitter circuit 19 for providing an output signal on line 26 having a frequency N times the input signal. Phase splitter circuit 19 may include a quadrature circuit 12 which is responsive to the input signal on line 14 for generating I and Q signals on lines 16 and 18, and a phasor circuit 20 for generating N signals with phase differences. Alternatively, phase splitter circuit 19 may include delay circuits to generate N signals with phase differences In one embodiment of the invention, Frequency multiplier 10a, FIG. 2, is a frequency tripler. Quadrature circuit 12a provides two signals on lines 16a and 18a with a 90 degree phase difference. Phasor circuit 20a is responsive to quadrature circuit 12a and provides three signals each spaced apart by 120° (i.e., 360°/N) on lines 22a. Phasor circuit 20a may provide the multiple phases of the input using linear vector addition of the quadrature signals. The phase-delayed waveforms may be sinewaves and may be converted to square-waves prior to mixing. An amplifier array 28 includes amplifier circuits for amplifying the phase-delayed signals and outputs the amplified signals to mixer circuit 24a on lines 30. Mixer circuit 24a is responsive to amplifier array 28 and mixes the three amplified signals spaced 120° apart to provide an output signal on line 26a having a frequency three times the input signal. Mixer circuit 24a may mix the three amplified signals by multiplying them.

Figure 3:
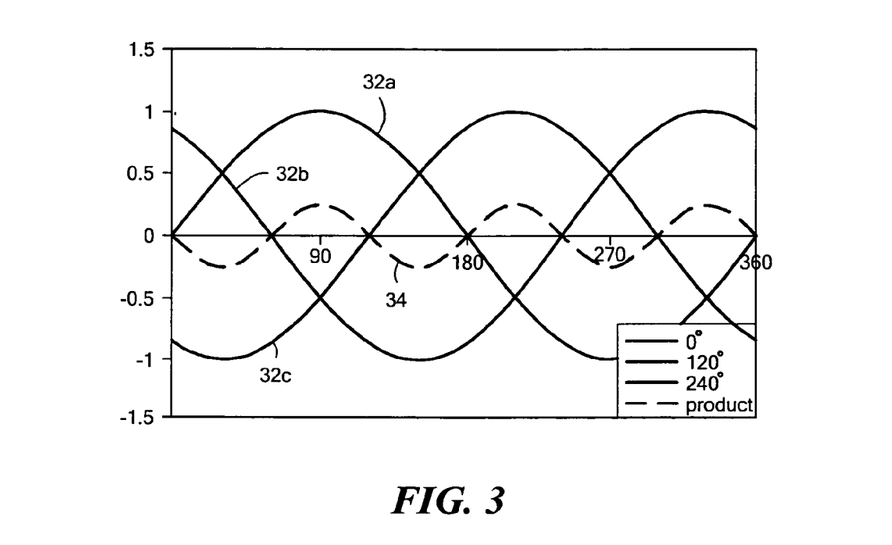
FIG. 3 is a graph showing sinusoidal waveforms at the input and output of the mixer of FIG. 2.
Figure 4:
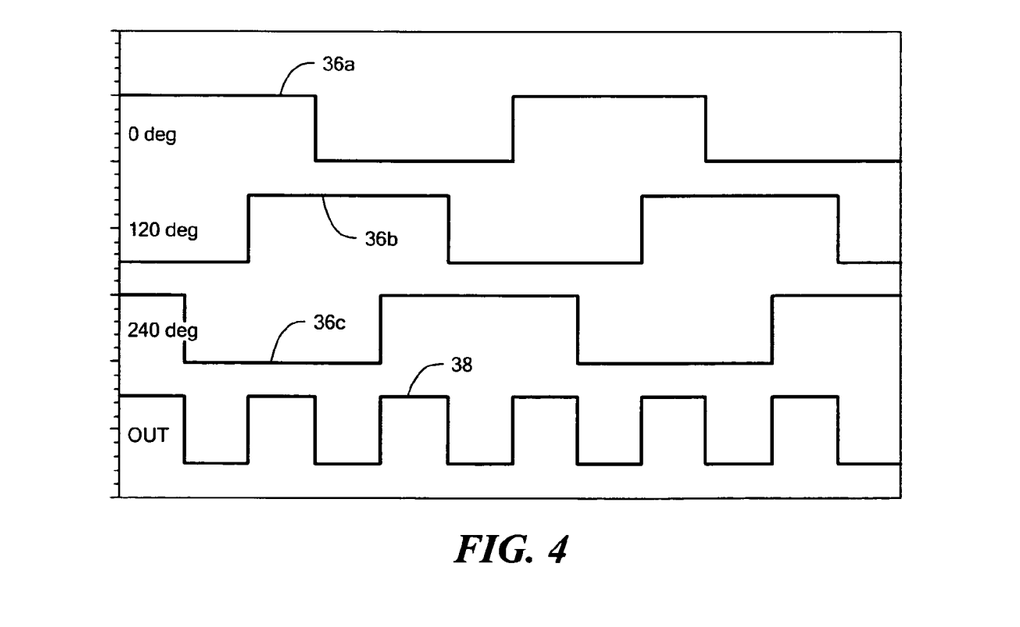
FIG. 4 is a graph showing square waveforms at the input and output of the mixer of FIG. 2.

The N waveforms provided to mixer 24a may be sinewaves 32a-c, FIG. 3, but may also be square-waves 36a-c, FIG. 4 to obtain the desired output frequency 34 or 38, respectively. If square-waves are used, each signal feeding the mixer multiplies the output by +1 or −1. This approach dictates that the transitions of the N square-waves (low-to-high or high-to-low) are equally spaced in time. The square-waves are preferably spaced in phase multiples of 180°/N where N is the frequency multiplication factor. Presenting square-waves to the mixer provides the advantages that the circuit will have constant output power over a relatively large range of input power due to the compression of the amplifiers feeding the mixer. Also, the fast transitions of the square waves will provide improved phase noise performance. This is a consequence of minimizing the noise in the differential-pairs of the mixer by steering the current from one side of a differential-pair to the other with a fast transition.

Exemplary waveforms at the input and output of the mixer block for a frequency quadrupler are shown in FIG. 4 in which four square-waves 40a-d are provided to mixer 24a to obtain the multiplied output frequency 42.

Figure 5:
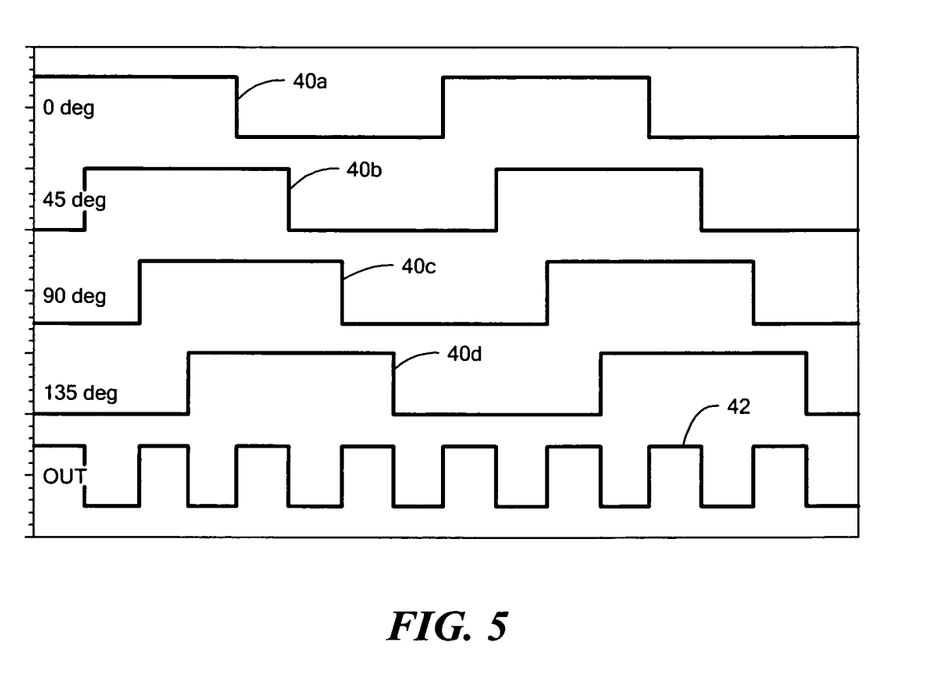
FIG. 5 is a graph showing square waveforms at the input and output of the mixer of FIG. 1 for a frequency quadrupler.

It is possible to regard each of the signals 36a-c and 40a-d shown in FIGS. 4 and 5, respectively, as switching between +1 and −1. If waveforms 36a-c or 40a-d are multiplied together, when any one of the inputs switches state, the output signal 38 or 42, respectively, will also change state. In this embodiment, however, if two of the inputs switch state at the same time, the output will not switch state. For this reason a phase difference of 180°/N is preferable to use for even multiples. A phase separation of 180°/N would also be acceptable for either even-order or odd-order multiples.

Frequency multiplier 10a may use Monolithic integration with a symmetrical circuit layout to provide intrinsic matching accuracy of both desired and parasitic circuit elements. Balanced signals may also be used between each interface.

Figure 6:
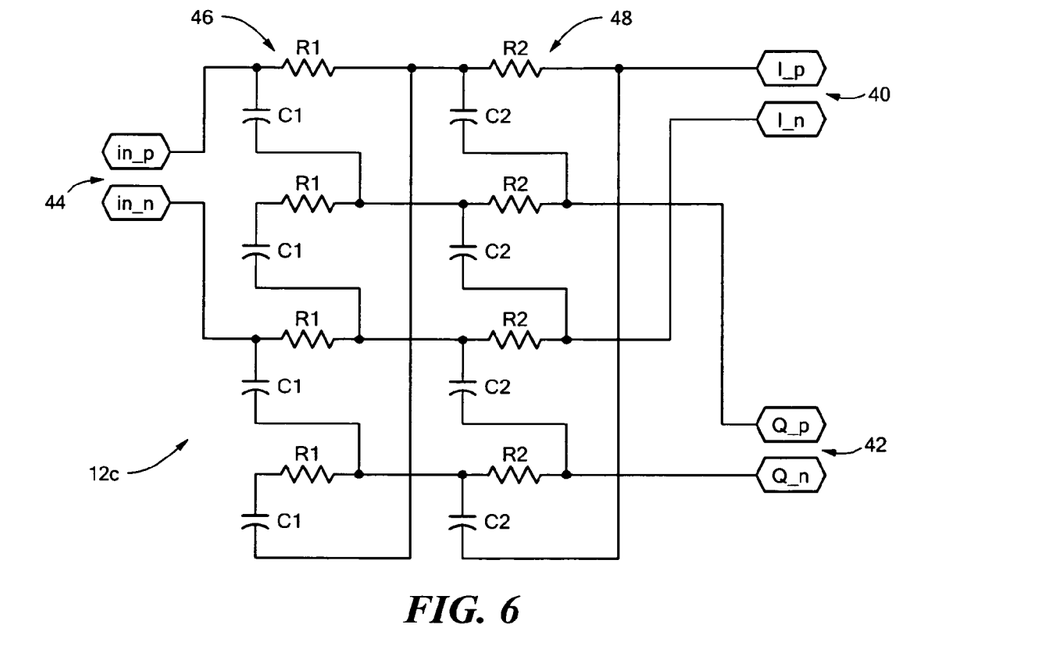
FIG. 6 is a circuit diagram of a two-stage R-C polyphase network used in the quadrature circuit of FIG. 2.

One embodiment of quadrature circuit 12c, FIG. 6, generates differential I and Q signals on differential lines 40 and 42, respectively, with 90 degree relative phase difference at the frequency of the input signal provided on differential input lines 44. Quadrature circuit 12c includes a two-stage R-C polyphase network which includes stages 46 and 48 stagger-tuned to achieve phase and amplitude balance over a broad frequency band. Quadrature circuit 12c includes a differential input 44, but the circuit can be driven by a single-ended input signal with little compromise in performance with the opposite differential input AC-coupled to ground. Although a polyphase network implementation is shown in FIG. 6, for very high frequencies a distributed quadrature network (e.g. a Lange coupler) may be preferable in some applications.

Figure 7:
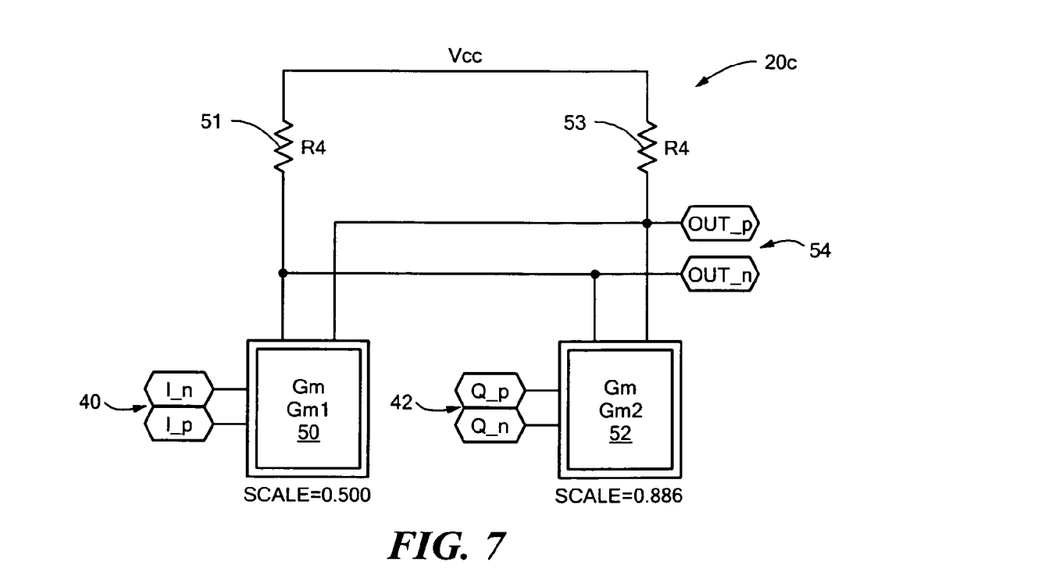
FIG. 7 is a circuit diagram of the circuitry used to generate 120° in the phasor circuit of FIG. 2.

Phasor circuit 20c, FIG. 7, is responsive to the I and Q signals on differential lines 40 and 42 respectively, generated by quadrature circuit 12c. Phasor circuit 20c performs vector addition by summing a linear combination of the I and Q signals. Phasor circuit 20c includes first and second Gm (transconductance) sub-circuits 50 and 52 which generate an output current that is linearly proportional to the input voltage. Currents from Gm circuits 50 and 52 are then summed in common load resistors 51 and 53 to create the desired phase output on differential lines 54.

Figure 8:
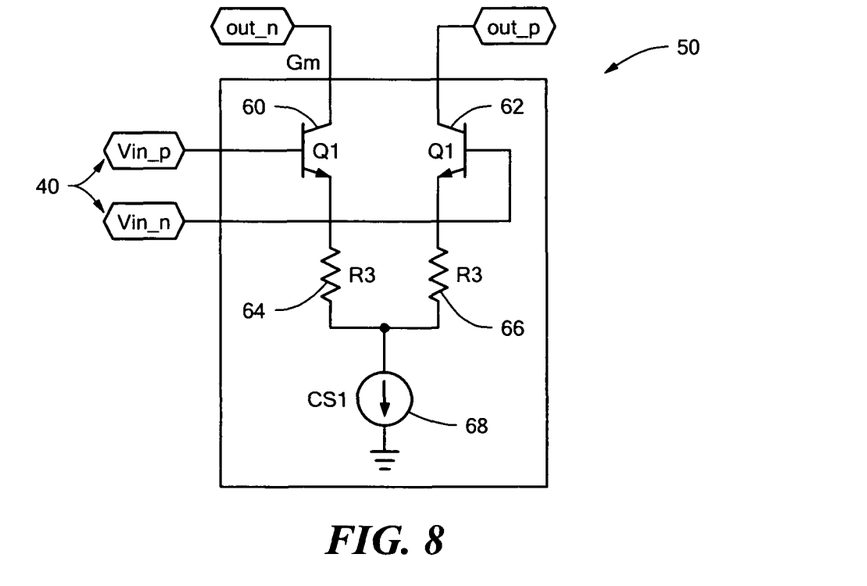
FIG. 8 is a circuit diagram of the transconductance subcircuit used in the phasor circuit of FIG. 2.

An exemplary Gm sub-circuit 50, FIG. 8, is scaled by appropriate sizing of transistors 60 and 62 and resistors 64 and 66 and the value of the current source 68 to provide the appropriate multiplication factor to achieve the desired phase (θ). Gm circuit 50 is responsive to the I signal on differential lines 40 and is scaled by cos(θ). Gm circuit 52 is responsive to the Q signal on differential lines 42 and is scaled by sin(θ). Differential inputs are swapped to provide a negative scaling factor.

Figure 9A:
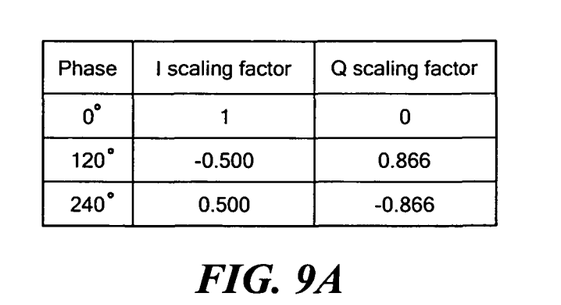
FIGS. 9a and 9b are tables showing the phases and effective I and Q scaling factors implemented in the phasor of FIG. 1 for a frequency tripler and a quadrupler, respectively.
Figure 9B:
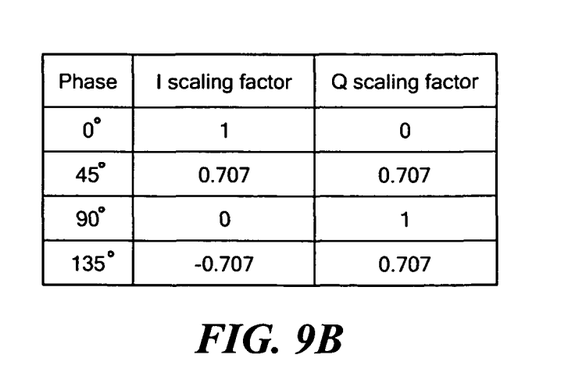

In one example, Phasor circuit 20c is used to generate 120° of phase between its output signals. In this case, the I inputs on differential lines 40 are swapped to give a negative scaling factor. The phases and effective I and Q scaling factors implemented in the phasor circuitry for the case of a frequency tripler and a quadrupler are shown in FIGS. 9a and 9b, respectively.

Figure 10:
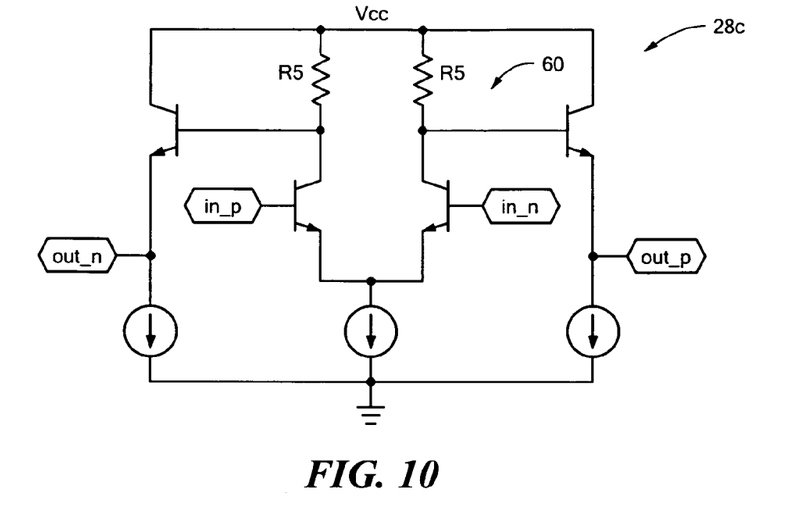
FIG. 10 is a circuit diagram of an amplifier used in the frequency multiplier of FIG. 2.

Amplifier circuit 28c, FIG. 10, is responsive to one of the outputs of phasor circuit 20c and amplifies the signal using a differential limiting amplifier circuit 60. A single-stage amplifier circuit 28c may be used to amplify each output of phasor circuit 20c. Alternatively, two or more amplifier stages may be cascaded as a function of the mixer circuit input being fed so as to compensate for differences in the input-output propagation delays between the mixer circuit inputs. Amplifier circuit 28c may also convert sinewaves to square-waves.

Figure 11:
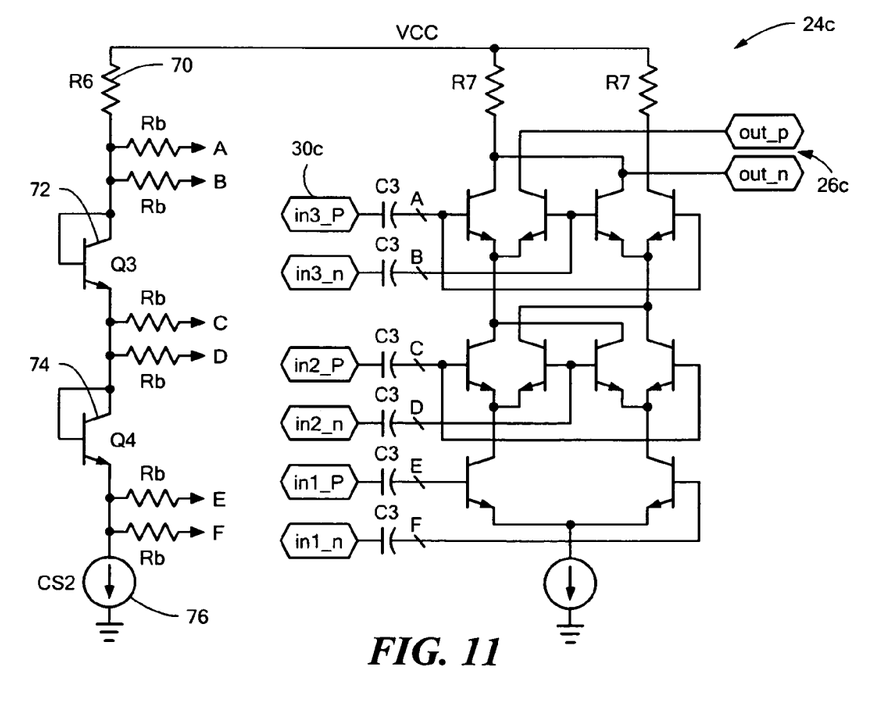
FIG. 11 is a circuit diagram of a three input stacked gilbert-cell mixer which is an exemplary mixer for the frequency multiplier of FIG. 2.

Mixer Circuit 24c, FIG. 11, is responsive to amplifier 28c and mixes the signals generated by the amplifier. In this embodiment, Mixer Circuit 24c is a 3-input stacked gilbert-cell mixer. Mixer Circuit 24c includes a resistor 70, transistors 72 and 74, and a current source 76 which is used to generate the DC bias voltages required for each level input of the gilbert-cell mixer.

A mixer circuit for a quadrupler preferably includes 4 levels of transistors to accommodate 4 inputs. For higher division ratios, the gilbert-cell mixers may be cascaded to provide sufficient voltage headroom. For example, to implement a times-6 multiplier, three waveforms may feed each of two gilbert cell mixers, the outputs of which would feed a third mixer.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A frequency multiplier for generating an output signal having a frequency N times an input signal, with N equal to or greater than 3, the frequency multiplier comprising:
   a phase splitter circuit responsive to the input signal for generating N signals with phase differences; and
   a mixer circuit responsive to the N signals of the phase splitter circuit configured to mix the N signals using a multiplying function to provide an output signal having a frequency N times the input signal.

2. The frequency multiplier of claim 1 in which the phase splitter circuit includes a quadrature circuit responsive to the input signal for generating I and Q signals and a phasor circuit responsive to the quadrature circuit.

3. The frequency multiplier of claim 2 in which the quadrature circuit includes an R-C polyphase network.

4. The frequency multiplier of claim 2 in which the quadrature circuit includes a distributed quadrature network.

5. The frequency multiplier of claim 4 in which the distributed quadrature network is a Lange coupler.

6. The frequency multiplier of claim 2 in which the phasor circuit includes a transconductance circuit for generating an output current that is linearly proportional to the I or Q signals.

7. The frequency multiplier of claim 6 further including common load resistors for adding the currents from the transconductance circuits to create a predetermined phase.

8. The frequency multiplier of claim 1 in which the difference of phase between the signals is approximately 360°/N.

9. The frequency multiplier of claim 1 in which the difference of phase between the signals is approximately 180°/N.

10. The frequency multiplier of claim 1 in which N=3.

11. The frequency multiplier of claim 10 in which the mixer circuit is a 3 input stacked Gilbert-cell mixer.

12. The frequency multiplier of claim 1 in which N=4 or greater.

13. The frequency multiplier of claim 1 in which the input signal is a differential input signal.

14. The frequency multiplier of claim 1 in which the input signal is a single-ended signal.

15. The frequency multiplier of claim 1 in which N=4 and the mixer circuit includes four levels of transistors to accommodate four balanced inputs.

16. The frequency multiplier of claim 1 in which the mixer circuit includes cascaded mixers.

17. The frequency multiplier of claim 1 in which the mixer circuit multiplies the N signals of the phasor circuit to provide an output signal having a frequency N times the input signal.

18. The frequency multiplier of claim 1 further including amplifier circuits responsive to the phase splitter circuit for amplifying the N signals.

19. The frequency multiplier of claim 18 in which the amplifier circuits convert the N signals from sine waves to square-waves.

20. The frequency multiplier of claim 18 in which the amplifier circuits include a single-stage amplifier to amplify each of the N signals.

21. The frequency multiplier of claim 18 in which the amplifier circuits include two or more amplifier stages to amplify some of the N signals.

22. A frequency multiplier for generating an output signal having a frequency N times an input signal, with N equal to or greater than 3, the frequency multiplier comprising:
a quadrature circuit responsive to the input signal for generating I and Q signals;
a phasor circuit responsive to the quadrature circuit for generating N signals with phase multiples of approximately 360°/N;
amplifier circuits responsive to the phasor circuit for amplifying the N signals; and
a mixer circuit responsive to the N signals of the phase splitter circuit configured to mix the N signals using a multiplying function to provide an output signal having a frequency N times the input signal.

23. A frequency multiplier for generating an output signal having a frequency N times an input signal, with N equal to or greater than 3, the frequency multiplier comprising:
a quadrature circuit responsive to the input signal for generating I and Q signals;
a phasor circuit responsive to the quadrature circuit for generating N signals with phase multiples of approximately 180°/N;
amplifier circuits responsive to the phasor circuit for amplifying the N signals and converting the N signals from sine waves to square-waves; and
a mixer circuit responsive to the amplifier circuits for detecting transitions of the amplified N signals to provide an output signal having a frequency N times the input signal.

24. A method for generating an output signal having a frequency N times the input signal, with N equal to or greater than 3, the method comprising:
generating N signals with phase differences;
mixing the N signals using a multiplying function to provide an output signal having a frequency N times the input signal.

25. The method of claim 24 in which the difference of phase between the signals is approximately 360°/N.

26. The method of claim 24 in which the difference of phase between the signals is approximately 180°/N.

27. A frequency multiplier for generating an output signal having a frequency N times an input signal, with N equal to or greater than 3, the frequency multiplier comprising:
a phase splitter circuit responsive to the input signal for generating N signals with phase differences, the phase splitter circuit including a quadrature circuit having a distributed quadrature network responsive to the input signal for generating I and Q signals and a phasor circuit responsive to the quadrature circuit; and
a mixer circuit responsive to the N signals of the phase splitter circuit configured to mix the N signals using a multiplying function to provide an output signal having a frequency N times the input signal.

28. A frequency multiplier for generating an output signal having a frequency N times a differential input signal, with N equal to or greater than 3, the frequency multiplier comprising:
a phase splitter circuit responsive to the differential input signal for generating N signals with phase differences; and
a mixer circuit responsive to the N signals of the phase splitter circuit for providing an output signal having a frequency N times the differential input signal.

* * * * *